(12) United States Patent
Kong et al.

(10) Patent No.: US 10,522,379 B2
(45) Date of Patent: Dec. 31, 2019

(54) SUBSTRATE TRANSFER APPARATUS

(71) Applicant: Samsung Electronics Co., Ltd., Suwon-si, Gyeonggi-do (KR)

(72) Inventors: Dae Wee Kong, Yongin-si (KR); Kang Min Park, Hwaseong-si (KR); Chul Hwan Choi, Seoul (KR); Yong Joon Hong, Seongnam-si (KR); Kang Soo Kim, Uiwang-si (KR); Sang Ho Roh, Seoul (KR); Heok Jae Lee, Suwon-si (KR); Sang Jin Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 100 days.

(21) Appl. No.: 15/707,023

(22) Filed: Sep. 18, 2017

(65) Prior Publication Data
US 2018/0122676 A1 May 3, 2018

(30) Foreign Application Priority Data

Oct. 31, 2016 (KR) .................. 10-2016-0142844

(51) Int. Cl.
| | | |
|---|---|---|
| *B01D 9/00* | (2006.01) |
| *H01L 21/677* | (2006.01) |
| *H01L 21/673* | (2006.01) |
| *F24F 3/16* | (2006.01) |
| *F04D 29/70* | (2006.01) |
| *F04D 25/16* | (2006.01) |
| *F24F 13/08* | (2006.01) |

(Continued)

(52) U.S. Cl.
CPC ...... *H01L 21/67772* (2013.01); *F24F 3/1603* (2013.01); *H01L 21/67366* (2013.01); *H01L 21/67393* (2013.01); *B01D 46/0002* (2013.01); *B01D 46/10* (2013.01); *B01D 50/00* (2013.01); *B01D 2273/30* (2013.01); *F04D 25/166* (2013.01); *F04D 29/664* (2013.01); *F04D 29/703* (2013.01); *F24F 1/0071* (2019.02); *F24F 3/161* (2013.01); *F24F 13/08* (2013.01)

(58) Field of Classification Search
CPC ......... H01L 21/67772; H01L 21/67393; H01L 21/67366; H01L 21/67017; F04D 25/166; F04D 29/703; F04D 29/664; F24F 1/0071; F24F 3/1603; F24F 3/161; F24F 13/08; B01D 46/10; B01D 2273/30; B01D 46/0002; B01D 50/00
See application file for complete search history.

(56) References Cited

U.S. PATENT DOCUMENTS 4,560,395 A * 12/1985 Davis .................... F24F 3/1603
                                                                96/381
5,470,363 A * 11/1995 Leader .................. B01D 46/10
                                                                96/385

(Continued)

FOREIGN PATENT DOCUMENTS

KR   2006-0066415   6/2006

*Primary Examiner* — Dung H Bui
(74) *Attorney, Agent, or Firm* — Myers Bigel, P.A.

(57) ABSTRACT

A substrate transfer apparatus includes: a chamber including a lower surface, an upper surface opposing the lower surface, and a side surface extending between the lower surface and the upper surface; and a fan filter unit disposed on the upper surface of the chamber and configured to introduce air into the chamber. The chamber includes an inclined surface extending from the upper surface to the side surface and positioned to a side of the fan filter unit.

15 Claims, 7 Drawing Sheets

(51) Int. Cl.
*B01D 50/00* (2006.01)
*B01D 46/10* (2006.01)
*B01D 46/00* (2006.01)
*F04D 29/66* (2006.01)
*F24F 1/0071* (2019.01)

(56) References Cited

U.S. PATENT DOCUMENTS

| | | | |
|---|---|---|---|
| 6,217,281 | B1 | 4/2001 | Jeng et al. |
| 6,364,762 | B1 * | 4/2002 | Kaveh ............... H01L 21/67778 |
| | | | 454/187 |
| 6,547,953 | B2 | 4/2003 | Suzuki et al. |
| 7,014,672 | B2 | 3/2006 | Ishihara et al. |
| 7,591,867 | B2 * | 9/2009 | Choi .................... F24F 3/1603 |
| | | | 454/187 |
| 7,670,397 | B2 | 3/2010 | Bauer |
| 8,469,650 | B2 | 6/2013 | Lee et al. |
| 2001/0049927 | A1 * | 12/2001 | Toepel ............... B01D 46/0002 |
| | | | 55/385.2 |
| 2003/0031537 | A1 | 2/2003 | Tokunaga |
| 2008/0045135 | A1 * | 2/2008 | Pfannenberg ......... F04D 29/646 |
| | | | 454/184 |
| 2015/0170945 | A1 | 6/2015 | Segawa et al. |

* cited by examiner

SUBSTRATE TRANSFER APPARATUS

CROSS-REFERENCE TO RELATED APPLICATION(S)

This application claims benefit of priority to Korean Patent Application No. 10-2016-0142844, filed on Oct. 31, 2016 in the Korean Intellectual Property Office, the disclosure of which is incorporated herein by reference in its entirety.

BACKGROUND

The present inventive concepts relate to a substrate transfer apparatus.

Substrate transfer devices, such as equipment front end modules (EFEMs), include chambers maintained at a high degree of cleanliness, and fan filter units (FFUs), allowing clean air to be introduced into chambers, are commonly disposed on upper portions of the chambers. Air is blown downwardly within chambers by fan filter units, and contamination particles in the chambers are transferred downstream of the chambers by air downflow and exhausted externally.

However, in the case of FFUs, gaps between inner sidewall surfaces of chambers and FFUs, caused due to mounting conditions thereof, may be present. Such gaps may cause the occurrence of backward facing step flow-type recirculation regions in corner portions of chambers, e.g., spaces formed as a portion of downflowing air flows backwards toward upper portions along sidewall surfaces thereof. Such recirculation regions may delay the discharge of floating contamination particles and cause contamination of sidewall surfaces, filters, wafers, and the like.

SUMMARY

An aspect of the present inventive concept is to provide an arrangement or scheme in which the occurrence of a recirculation region and contamination occurring thereby may be inhibited or prevented.

According to an aspect of the present inventive concept, a substrate transfer apparatus includes: a chamber including a lower surface, an upper surface opposing the lower surface, and a side surface extending between the lower surface and the upper surface; and a fan filter unit disposed on the upper surface of the chamber and configured to introduce air into the chamber. The chamber includes an inclined surface extending from the upper surface to the side surface and positioned to a side of the fan filter unit.

According to an aspect of the present inventive concept, a substrate transfer apparatus includes: a chamber including a lower surface, an upper surface opposing the lower surface, and a side surface extending between the lower surface and the upper surface; and a fan filter unit disposed on the upper surface of the chamber and configured to allow air to be introduced into the chamber. The fan filter unit protrudes downwardly from the upper surface toward the lower surface to allow the air to be blown radially into the chamber.

According to an aspect of the present inventive concept, a substrate transfer apparatus includes: a chamber including a lower wall, an upper wall and a side wall extending between the lower wall and the upper wall; and a fan filter unit on the upper wall. The fan filter unit is configured to draw external air into the chamber and direct the air toward or along an inner surface of the side wall.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, example embodiments of the present inventive concept will be described with reference to the accompanying drawings.

Figure 1:
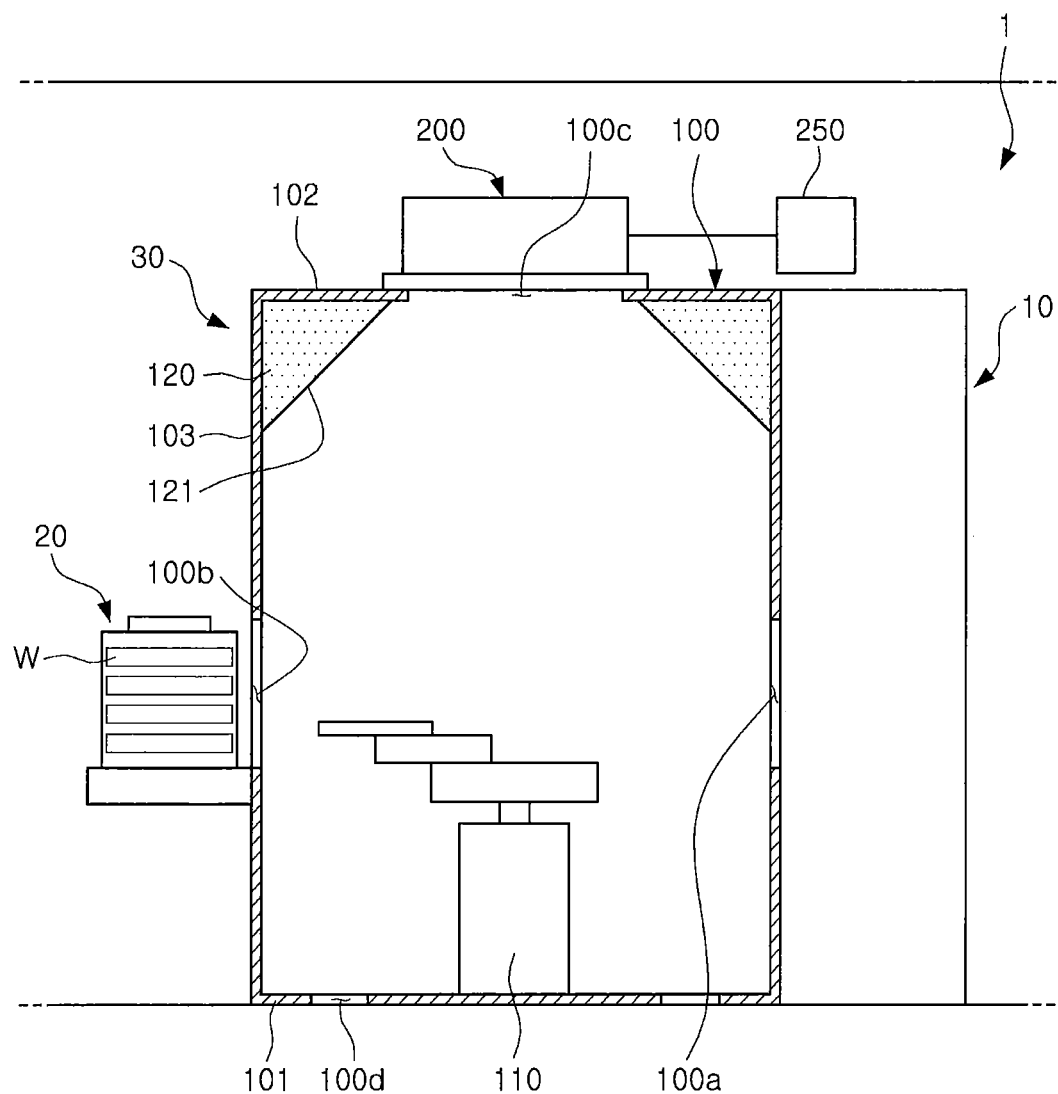
FIG. 1 is a schematic cross-sectional view of a substrate transfer apparatus according to an example embodiment of the present inventive concept.

With reference to FIG. 1, a substrate transfer apparatus according to an example embodiment will be described. FIG. 1 is a schematic cross-sectional view of a substrate transfer apparatus according to an example embodiment.

A substrate transfer apparatus 30 according to an example embodiment may be installed in a cleanroom 1 in which a predetermined degree of cleanliness is maintained. The substrate transfer apparatus 30 may be connected to a process chamber 10 in which a predetermined process is performed on a substrate W. For example, the process chamber 10 may be a chamber in which processes such as chemical vapor deposition, etching, photolithography, cleaning, and the like may be performed. The substrate transfer apparatus 30 may be connected to a container 20 accommodating a plurality of substrates W therein. The container 20 may be a hermetically sealed container having a door formed in such a manner that external air may not be introduced into the container 20. For example, a front opening unified pod (FOUP) may be used as the container 20. In the example embodiment, the substrate W will be described as a wafer as an example. In addition, the substrate W may be any other type of substrate used for manufacturing of an integrated circuit.

The substrate transfer apparatus 30 may be disposed between the container 20 and the process chamber 10, and may transfer the substrate W, for example, wafers, between the container 20 and the process chamber 10. The substrate transfer apparatus 30 may include, for example, an equipment front end module (EFEM).

The substrate transfer apparatus 30 may include a chamber 100 in which a relatively high degree of cleanliness is maintained in an interior thereof, and a fan filter unit (FFU) 200 allowing for introduction of clean air into the chamber 100.

The chamber 100 may include a first surface or wall 101, a second surface or wall 102 opposing the first surface 101, provided as an upper surface thereof, and a third surface or wall 103 disposed between the first surface 101 and the second surface 102 to connect the first surface 101 and the second surface 102 to each other. The first, second and third surfaces 101, 102 and 103 may be a bottom surface or wall, an upper surface or wall, and a side surface or wall of the chamber 100, respectively. The chamber 100 may have a substantially rectangular parallelepiped shape, and may include a transfer robot 110 disposed therein for transferring the substrate W between the container 20 and the process chamber 10.

The chamber 100 may include an inlet portion or opening 100a formed in one side thereof, for example, the side of the third surface 103 connected to the process chamber 10, through which the substrate W may be transferred. The other side of the chamber 100, for example, the side of the third surface 103 connected to the container 20, may have an entrance portion or opening 100b through which the substrate W may be transferred between the container 20 and the chamber 10.

The chamber 100 may include an opening 100c formed in the second surface 102 for allowing for the introduction of external air thereinto. In addition, the chamber 100 may include an exhaust portion or opening 100d formed in the first surface 101 to externally discharge air from an interior of the chamber 100, together with the discharge of fumes.

The fan filter unit 200 may be disposed on the second surface 102 of the chamber 100 to allow air to be introduced into the chamber 100. The fan filter unit 200 may have a transverse cross-sectional size smaller than that of the second surface 102 but greater than a diameter or width of the opening 100c. The fan filter unit 200 may be disposed on the second surface 102 in a structure in which it covers the opening 100c formed in the second surface 102. The fan filter unit 200 may have an area greater than that of the opening 100c so that the fan filter unit 200 completely covers the opening 100c.

Figure 2:
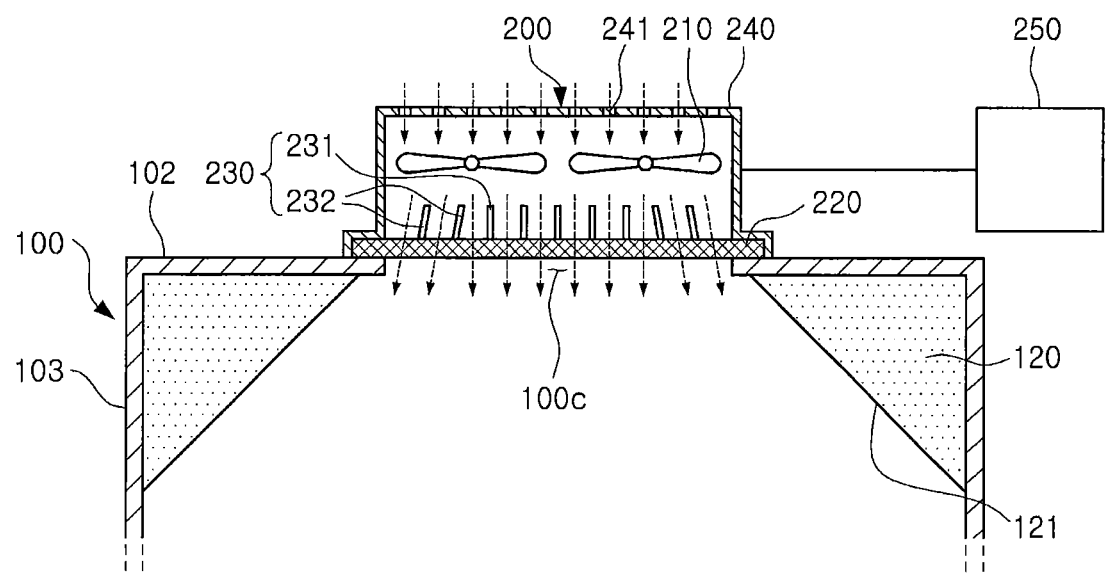
FIG. 2 is a schematic cross-sectional view of a fan filter unit in the substrate transfer apparatus of FIG. 1.

FIG. 2 schematically illustrates the fan filter unit 200. With reference to FIG. 2, the fan filter unit 200 may include a fan 210, a filter 220, a guide portion 230, and a housing 240.

The fan 210 may be rotated by a motor to allow air from the cleanroom 1 to be introduced into the chamber 100 and then blown downwardly within the chamber 100.

The filter 220 may be disposed below the fan 210, and may be exposed internally from the chamber 100 through the opening 100c. The filter 220 may filter contaminants from the air to thus allow clean air to flow into the chamber 100.

The guide portion 230 may be disposed between the fan 210 and the filter 220 to adjust a blowing direction of air blown into the chamber 100. The guide portion 230 may include a first vane 231 (or a plurality of first vanes 231) for guiding air to be blown in a direction substantially perpendicular to the first surface 101 (e.g., substantially parallel to the third surface 103), and a second vane 232 (or a plurality of second vanes 232) for guiding air to be blown obliquely toward the third surface 103 (or toward an inner surface of the third wall 103).

The housing 240 may hold or receive the fan 210, the filter 220, and the guide portion 230 therein. The housing 240 may be disposed on the second surface 102 to be supported thereby. The housing 240 may have inflow holes 241 allowing for the inflow of air.

The fan filter unit 200 may be connected to a control unit 250, and the control unit 250 may control operations of the fan filter unit 200. For example, the control unit 250 may control a rotation speed of the fan 210 in various manners according to states of operations of the fan filter unit 200. In addition, an operation of the fan 210 may be stopped by the control unit 250 if an abnormal state occurs. The control unit 250 may display information regarding a rotational speed of the fan 210, a state of interior of the chamber 100, and the like, for example, through a display device.

The chamber 100 may have an inclined surface 121 extending from the second surface 102 toward the third surface 103, to be formed to a side of the fan filter unit 200. In detail, the chamber 100 may include corner blocks 120 mounted on corner portions at which the second surface 102 and the third surface 103 meet or are connected to each other to provide the inclined surfaces 121 within the chamber 100.

For example, the corner block 120 may have a right-angled triangular cross-sectional structure, and a surface thereof forming a hypotenuse may correspond to the inclined surface 121. The inclined surface 121 may extend downwardly from a circumference of the opening 100c of the second surface 102 toward the third surface 103 and may be located to be higher than a position of the entrance portion 100b of the third surface 103.

The inclined surface 121 may have a curved cross-sectional shape as well as a linear cross-sectional shape. A shape of the inclined surface 121 may be variously modified in consideration of a flow speed and direction of air, and the like.

Figure 3:
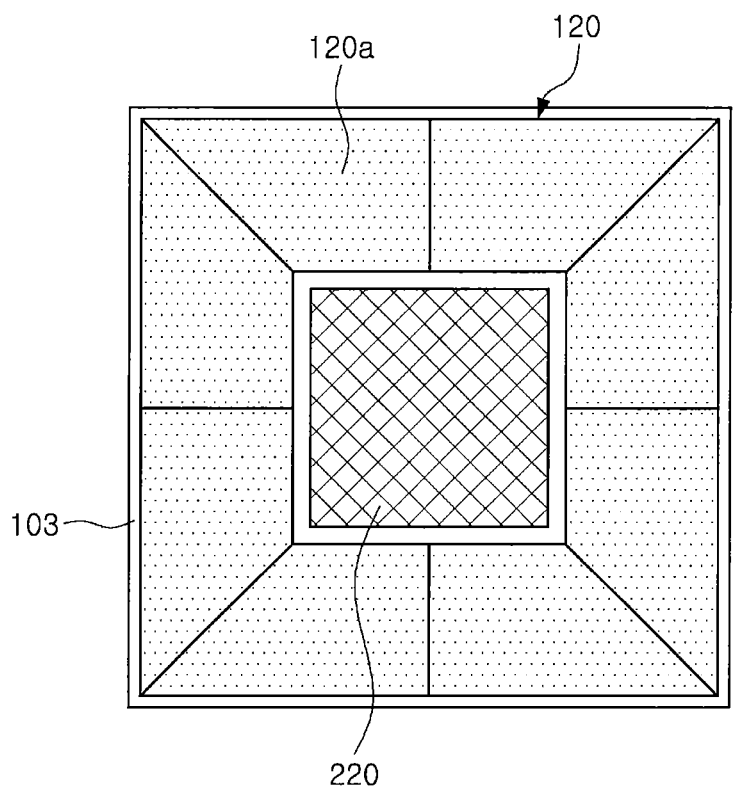
FIG. 3 is a bottom view of the fan filter unit in the substrate transfer apparatus of FIG. 2.

FIG. 3 schematically illustrates the second surface 102 of the chamber 100 as viewed from below. As illustrated in FIG. 3, the corner block 120 may include a plurality of divided members 120a (or corner block members 120a). Thus, the plurality of divided members 120a may be assembled in various manners to correspond to various sizes and shapes of the chamber 100. The plurality of divided members 120a may surround an outer periphery of the opening 100c and extend between the second surface 102 and the third surface 103 to define the inclined surface 121.

The corner block 120 may be detachably mounted in the chamber 100.

Figure 4A:
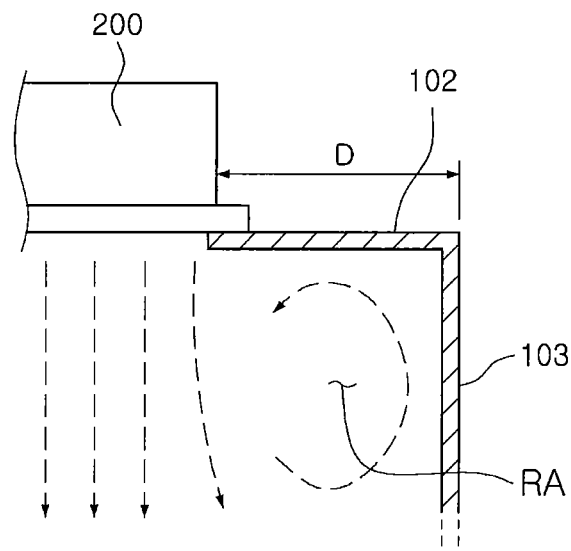
FIGS. 4A and 4B are cross-sectional views schematically illustrating corner portions of a chamber in respective cases in which a corner block is not provided and in which a corner block is provided.
Figure 4B:
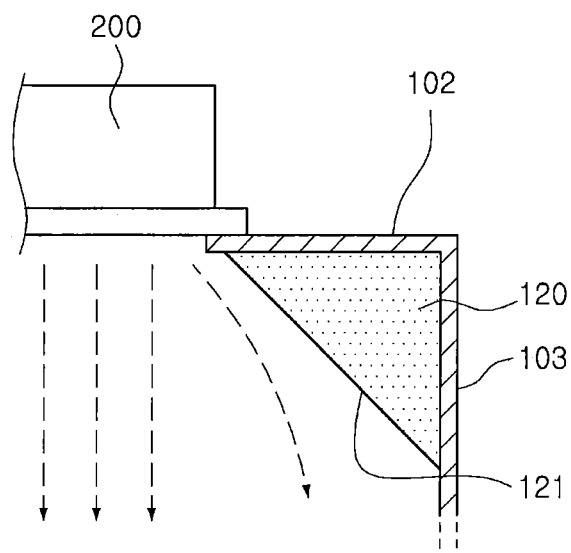

FIGS. 4A and 4B schematically illustrate corner portions of the chambers in the case in which the corner block is not provided and in the case in which the corner block is provided, respectively.

Referring to FIG. 4A, since the fan filter unit 200 is located on the second surface 102 at a central region thereof, a gap D may be present between the fan filter unit 200 and the third surface 103 corresponding to a side wall surface of the chamber 100. The gap D may cause the occurrence of a recirculation region RA of a backward facing step flow type on the third surface 103 by a flow of air flowing downwardly within the chamber 100 through the fan filter unit 200. The recirculation region RA may be generally formed in a corner portion at which the second surface 102 and the third surface 103 are connected, and downflowing air may flow backwards along the third surface 103 to thus delay discharge of floating contamination particles and fumes, thereby causing contamination of an inner wall, a filter, a wafer, and the like, or reducing wafer pattern reliability.

Referring to FIG. 4B, the corner block 120 may be disposed on the corner portion, thereby preventing or reducing the occurrence of the recirculation region RA and thus preventing contamination particles from flowing backwards and remaining in the chamber without being discharged. For example, the occurrence of a gap between the fan filter unit 200 and a sidewall surface of the chamber may be substantially reduced via the corner block 120.

Figure 5:
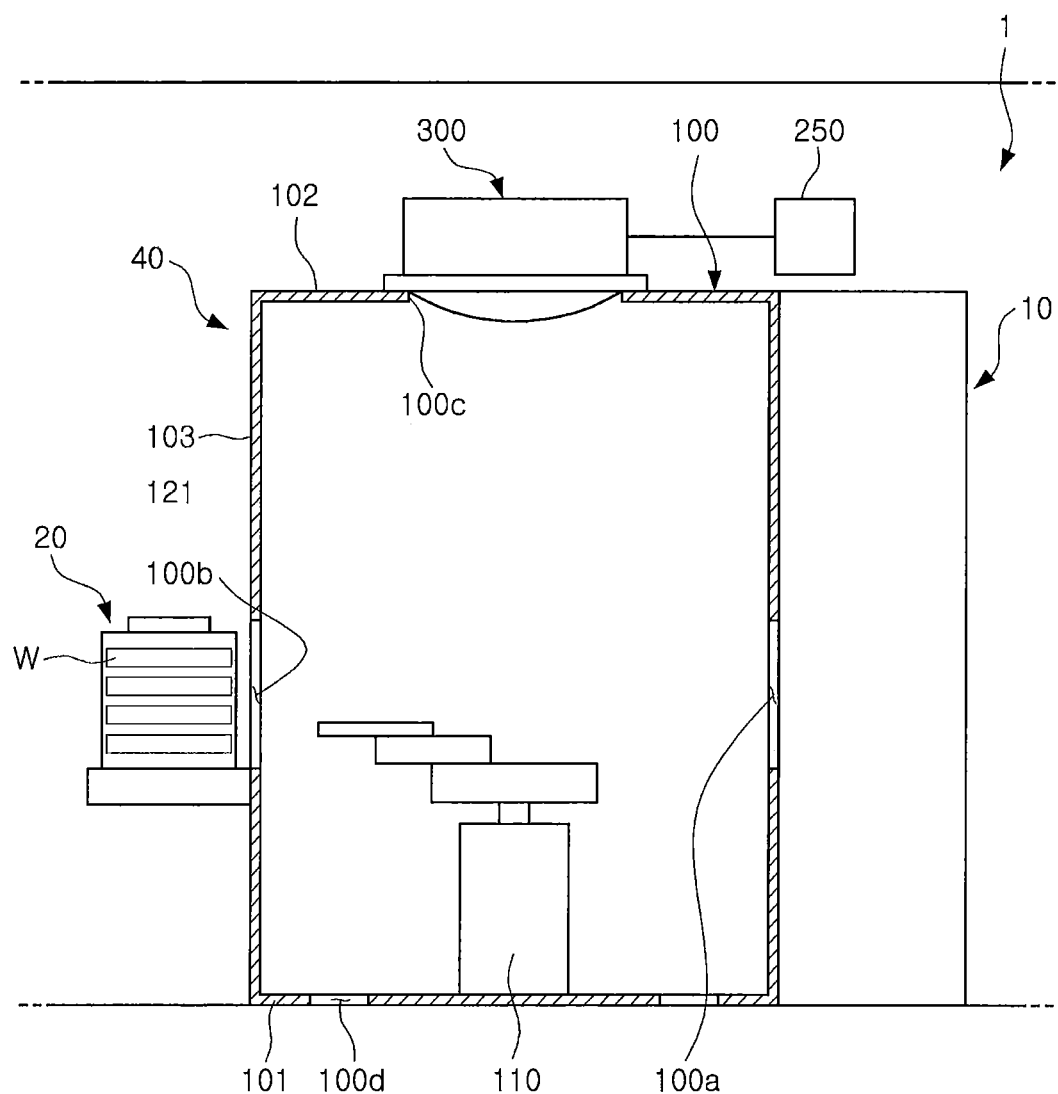
FIG. 5 is a schematic cross-sectional view of a substrate transfer apparatus according to an example embodiment of the present inventive concept.

With reference to FIG. 5, a substrate transfer apparatus according to an example embodiment will be described. FIG. 5 is a cross-sectional view schematically illustrating a substrate transfer apparatus according to an example embodiment.

With reference to FIG. 5, a substrate transfer apparatus 40 may include a chamber 100 disposed between a container 20 and a process chamber 10, and a fan filter unit 300 allowing for the introduction of air into the chamber 100.

The chamber 100 may include a first surface or wall 101, a second surface or wall 102 disposed on an upper portion thereof to oppose the first surface 101, a third surface or wall 103 disposed between the first surface 101 and the second surface 102 to connect the first surface 101 and the second surface 102.

The chamber 100 may include an inlet portion or opening 100a formed in the third surface 103 at one side thereof connected to the process chamber 10. Further, the chamber 100 may include an entrance portion or opening 100b formed in the third surface 103 at the other side thereof connected to the container 20.

The chamber 100 may include an opening 100c formed in the second surface 102 to allow for the introduction of external air thereinto. Further, the chamber 100 may include an exhaust portion or opening 100d formed in the first surface 101.

A transfer robot 110 for transferring a substrate W between the container 20 and the process chamber 10 may be disposed in the chamber 100.

The fan filter unit 300 may be disposed on the second surface 102 of the chamber 100 to allow air to be introduced into the chamber 100. The fan filter unit 300 may be disposed on the second surface 102 in a structure in which it covers the opening 100c formed in the second surface 102.

The fan filter unit 300 may have a structure protruding downwardly from the second surface 102 toward the first surface 101, to thus radially blow the air into the chamber 100. For example, the fan filter unit 300 may have a structure in which a portion thereof exposed internally in the chamber 100 protrudes downwardly in a dome shape. The fan filter unit 300 may be curved convexly relative to the first surface 101 and may extend downwardly below the second surface 102.

Figure 6:
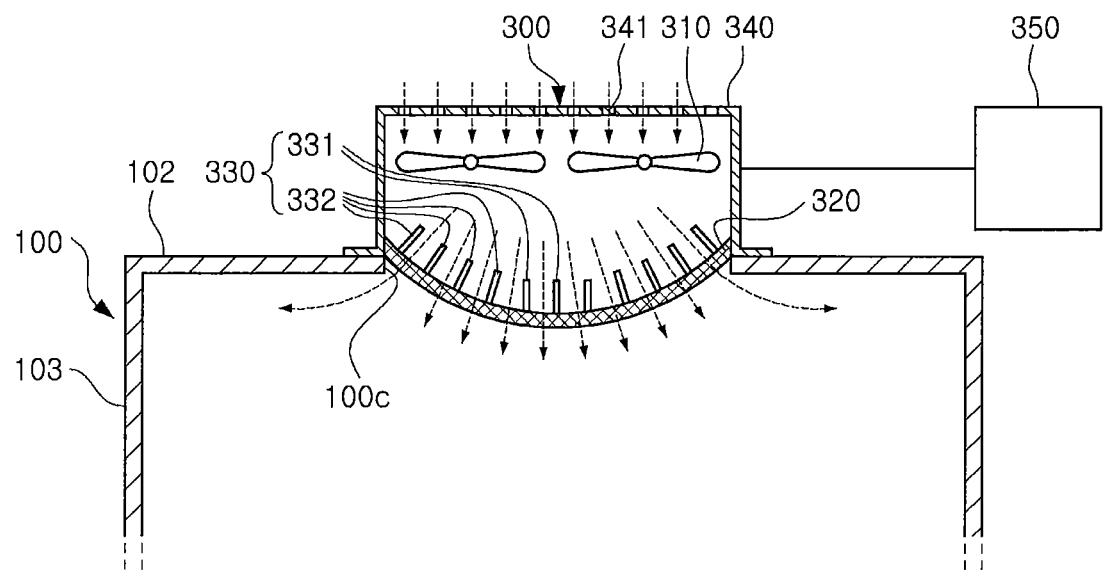
FIG. 6 is a schematic cross-sectional view of a fan filter unit in the substrate transfer apparatus of FIG. 5.

FIG. 6 is a cross-sectional view schematically illustrating the fan filter unit. Referring to FIG. 6, the fan filter unit 300 may include a fan 310, a filter 320, a guide portion 330, and a housing 340.

The fan 310 may be rotated by a motor to allow air from the cleanroom 1 to be introduced into the chamber 100 and then blown downwardly within the chamber 100.

The guide portion 330 may be disposed below the fan 310 to adjust a blowing direction of air blown into the chamber 100. The guide portion 330 may include a first vane 331 (or a plurality of first vanes 331) for guiding the air to be blown toward the first surface 101 and a second vane 332 (or a plurality of second vanes 332) for guiding the air to be blown toward the third surface 103 (or toward an inner surface of the third wall 103).

The filter 320 may be disposed below the guide portion 330 and may be exposed internally in the chamber 100 through the opening 100c. The filter 320 may filter contaminants from the air to allow clean air to flow into the chamber 100. The filter 320 may have a central portion protruding downwardly from the second surface 102 toward the first surface 101. The filter 320 may be curved convexly relative to the first surface 101 and may extend downwardly below the second surface 102.

The housing 340 may hold or receive the fan 310, the filter 320, and the guide portion 330 therein. The housing 340 may be disposed on the second surface 102 to be supported thereby. Thus, as the housing 340 is disposed on and supported by the second surface 102, the fan filter unit 300 may be mounted on the chamber 100.

The fan filter unit 300 may be connected to a control unit 350, and the control unit 350 may control operations of the fan filter unit 300.

In the example embodiment, the fan filter unit 300 has a structure in which a portion thereof exposed internally in the chamber 100 protrudes downwardly in a dome shape, and may thus radially blow air into the chamber 100. In detail, as air may be implemented to flow downward along the third surface 103 by blowing air toward the third surface 103, a case in which air flows backwards toward an upper portion along a sidewall surface of a chamber in the related art may be reduced or prevented from occurring. Thus, the occurrence of a recirculation region occurring thereby may be inhibited or prevented.

Figure 7:
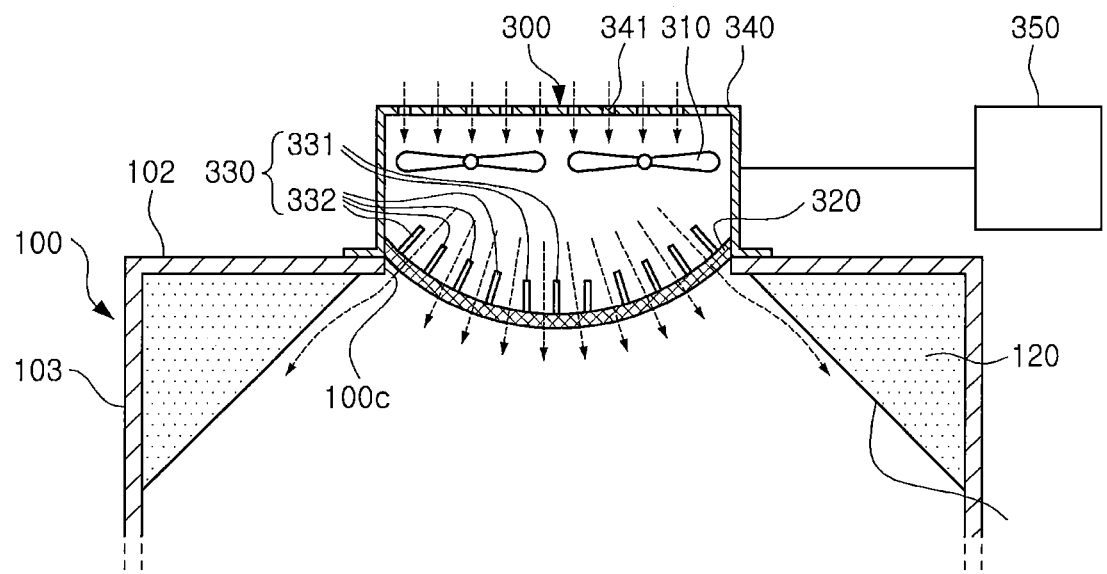
FIG. 7 is a cross-sectional view schematically illustrating a modified example of the substrate transfer apparatus of FIG. 5.

FIG. 7 schematically illustrates a modified example of the substrate transfer apparatus. As illustrated in FIG. 7, in the chamber 100 according to an example embodiment, a corner block 120 having an inclined surface 121 may be further mounted in a corner portion of the chamber 100 at which the second surface 102 and the third surface 103 of the chamber 100 meet or are connected to each other. The occurrence of a recirculation region in corner portions may be further inhibited or prevented via the corner block 120.

Figure 8:
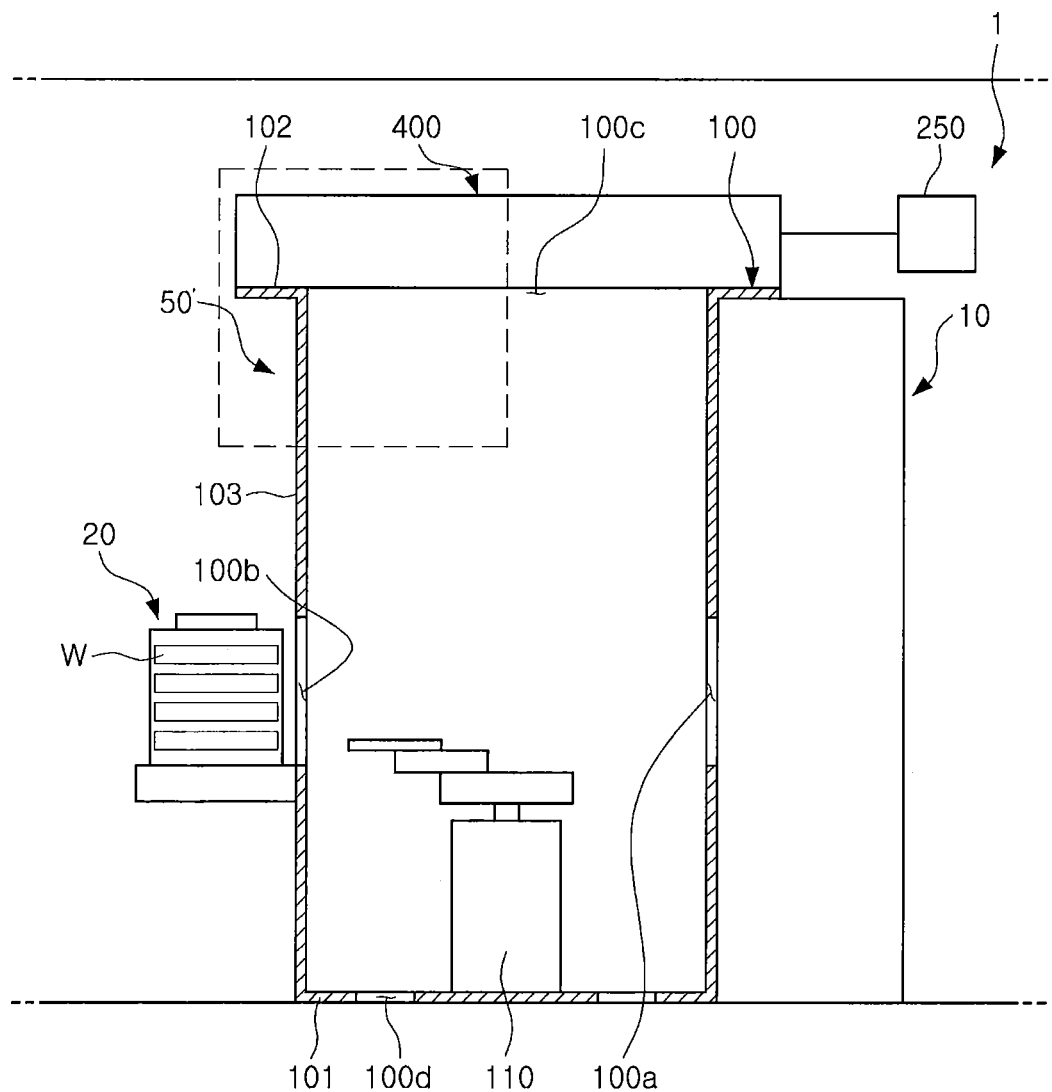
FIG. 8 is a schematic cross-sectional view of a substrate transfer apparatus according to an example embodiment of the present inventive concept.
Figure 9:
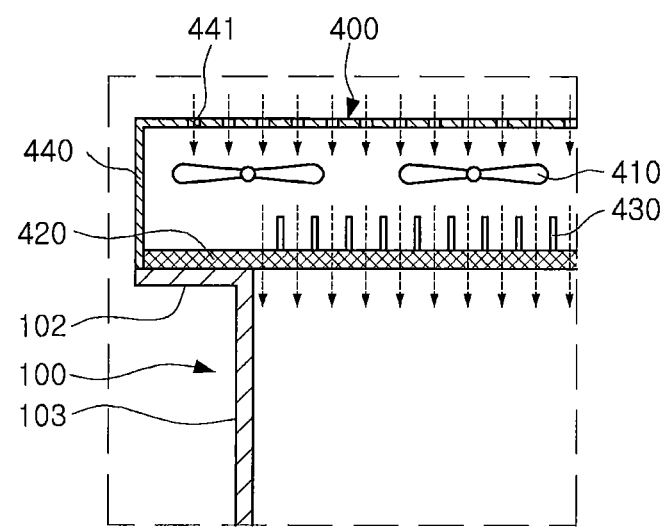
FIG. 9 is a cross-sectional view schematically illustrating a corner portion of the substrate transfer apparatus of FIG. 8.

With reference to FIGS. 8 and 9, a substrate transfer apparatus according to an example embodiment will be described. FIG. 8 is a cross-sectional view schematically illustrating a substrate transfer apparatus according to an example embodiment. FIG. 9 is a cross-sectional view schematically illustrating a corner portion of the substrate transfer apparatus of FIG. 8.

With reference to FIGS. 8 and 9, a substrate transfer apparatus 50 may include a chamber 100 disposed between a container 20 and a process chamber 10, and a fan filter unit 400 allowing for the introduction of air into the chamber 100.

The chamber 100 may include a first surface or wall 101 at a bottom surface thereof, a third surface or wall 103 extending upwardly from an edge of the first surface or wall 101 and corresponding to a sidewall surface of the chamber 100, and a second surface or wall 102 extending outwardly (e.g., radially outwardly) from an edge of the third surface 103 and corresponding to a support frame. For example, the chamber 100 may have a substantially box-shaped structure having an open upper portion. The second surface 102 may take the form of an upper flange extending outwardly from an upper edge or portion of the third surface 103.

The chamber 100 may include an inlet portion or opening 100a formed in the third surface 103 at one side thereof connected to the process chamber 10. Further, the chamber 100 may include an entrance portion or opening 100b formed in the third surface 103 at the other side thereof connected to the container 20. The chamber 100 may include an opening 100c formed in the second surface 102 (and/or defined by the upper edge or portion of the third surface or wall 103) to allow for introduction of external air thereinto. Further, the chamber 100 may include an exhaust portion or opening 100d formed in the first surface 101.

A transfer robot 110 for transferring a substrate W between the container 20 and the process chamber 10 may be disposed in the chamber 100.

The fan filter unit 400 may be disposed on the second surface 102 of the chamber 100 to be supported thereby. The fan filter unit 400 may cover an open upper portion of the chamber 100 while being supported by the second surface 102.

With reference to FIG. 9, the fan filter unit 400 may include a fan 410, a filter 420, a guide portion 430, and a housing 440 including inlet holes 441. In a manner different from that of the fan filter units 200 and 300 according to the example embodiments illustrated in FIGS. 1 and 5, the fan filter unit 400 may have a structure in which a transverse cross-sectional size thereof is greater than a transverse cross-sectional size of the chamber 100. In other words, the fan filter unit 400 may have an area that is greater than the opening 100c and may completely cover the opening 100c.

In the example embodiment, since the fan filter unit 400 through which air is blown has a structure in which a lower surface thereof extends to an outer region of the third surface 103 of the chamber 100, a gap between the fan filter unit 400 and the third surface 103 may not be present. Thus, the fan filter unit 400 may implement a flow of air flowing substantially vertically downward on an outer region of the chamber 100, as well as the entirety of internal region of the chamber 100 including along the third surface 103 (or an inner surface of the third wall 103).

As set forth above, according to example embodiments, a substrate transfer apparatus may be provided in which occurrence of a recirculation region and contamination caused thereby may be inhibited or prevented.

While example embodiments have been shown and described above, it will be apparent to those skilled in the art that modifications and variations could be made without departing from the scope of the present disclosure as defined by the appended claims.

What is claimed is:

1. A substrate transfer apparatus comprising:
    a chamber including a lower surface, an upper surface opposing the lower surface, and a side surface extending between the lower surface and the upper surface; and
    a fan filter unit disposed above and on the upper surface of the chamber and configured to introduce air into the chamber,
    wherein the chamber includes an inclined surface extending from the upper surface to the side surface and positioned to a side of the fan filter unit,
    wherein the substrate transfer apparatus further comprises a corner block mounted below the upper surface in a corner portion at which the upper surface and the side surface meet to provide the inclined surface within the chamber,
    wherein an opening is defined in the upper surface for allowing introduction of air into the chamber, wherein the corner block comprises a plurality of divided members, and wherein the plurality of divided members are arranged around an entire periphery of the opening, and
    wherein the inclined surface provided by the corner block is flat.

2. The substrate transfer apparatus of claim 1, wherein the chamber comprises an entrance portion in the side surface through which a substrate can be transferred, and the inclined surface is positioned above the entrance portion.

3. The substrate transfer apparatus of claim 1, wherein the corner block is detachably mounted in the chamber and comprises a plurality of divided members.

4. The substrate transfer apparatus of claim 1, wherein the fan filter unit comprises:
    a fan configured to introduce external air into the chamber and to blow the air downwardly within the chamber;
    a filter configured to filter the external air;
    a guide portion configured to adjust a blowing direction of the external air; and
    a housing accommodating the fan, the filter, and the guide portion in an interior of the housing.

5. The substrate transfer apparatus of claim 4, wherein the guide portion comprises a first vane configured to guide the external air to be blown in a direction toward the lower surface, and a second vane configured to guide the external air to be blown in a direction toward the side surface.

6. The substrate transfer apparatus of claim 1, further comprising an exhaust portion provided in the lower surface of the chamber and configured to externally discharge air from an interior of the chamber.

7. The substrate transfer apparatus of claim 1, wherein the chamber is disposed between a container for receiving a substrate and a process chamber, and the apparatus further includes a transfer robot disposed in the chamber that is configured to transfer the substrate between the container and the process chamber.

8. The substrate transfer apparatus of claim 1, further comprising a control unit configured to control operations of the fan filter unit.

9. The substrate transfer apparatus of claim 1, wherein the chamber comprises an opening in the upper surface for allowing introduction of air into the chamber.

10. The substrate transfer apparatus of claim 9, wherein the fan filter unit overlaps the upper surface and completely covers the opening.

11. A substrate transfer apparatus comprising:
    a chamber including a lower surface, an upper surface opposing the lower surface, and a side surface extending between the lower surface and the upper surface; and
    a fan filter unit disposed above and on the upper surface of the chamber and configured to allow air to be introduced into the chamber,
    wherein the chamber includes an inclined surface extending from the upper surface to the side surface and positioned to a side of the fan filter unit,
    wherein the substrate transfer apparatus further comprises a corner block mounted below the upper surface in a corner portion at which the upper surface and the side surface meet to provide the inclined surface within the chamber,
    wherein the fan filter unit protrudes downwardly from the upper surface toward the lower surface to allow the air to be blown radially into the chamber,
    wherein an opening is defined in the upper surface for allowing introduction of air into the chamber, wherein the corner block comprises a plurality of divided members, and wherein the plurality of divided members are arranged around an entire periphery of the opening,
    wherein the inclined surface provided by the corner block is flat.

12. The substrate transfer apparatus of claim 11, wherein a portion of the fan filter unit that is exposed to an interior of the chamber protrudes downwardly in a dome shape.

13. A substrate transfer apparatus comprising:
a chamber including a lower wall, an upper wall and a side wall extending between the lower wall and the upper wall; and
a fan filter unit above and on the upper wall,
wherein the fan filter unit is configured to draw external air into the chamber and direct the air toward or along an inner surface of the side wall,
wherein the upper wall extends inwardly from the side wall, and wherein an opening is defined in the upper wall and the fan filter unit covers the opening, the substrate transfer apparatus further comprising a plurality of corner block members below the upper wall and arranged around an entire periphery of the opening, with each corner block member extending between the upper wall and the side wall to define an inclined surface between the upper wall and the side wall, and
wherein the inclined surface defined by each corner block member is flat.

14. The substrate transfer apparatus of claim 13, wherein the fan filter unit comprises a guide portion including a plurality of first guide vanes configured to direct the air downwardly toward the lower wall and a plurality of second guide vanes arranged around the first guide vanes and configured to direct the air toward the inner surface of the side wall.

15. The substrate transfer apparatus of claim 13, wherein the fan filter unit comprises a filter that protrudes downwardly below the upper wall and is curved convexly relative to the lower wall.

* * * * *